United States Patent [19]

Spencer

[11] Patent Number: 5,383,788
[45] Date of Patent: Jan. 24, 1995

[54] ELECTRICAL INTERCONNECT ASSEMBLY

[75] Inventor: Mark Spencer, Phoenix, Ariz.

[73] Assignee: W. L. Gore & Associates, Inc., Newark, Del.

[21] Appl. No.: 65,344

[22] Filed: May 20, 1993

[51] Int. Cl.6 .............................................. H01R 9/09
[52] U.S. Cl. ..................................... 439/67; 439/493
[58] Field of Search ................ 439/67, 77, 492, 493, 439/329

[56] References Cited

U.S. PATENT DOCUMENTS

| | | |
|---|---|---|
| 3,102,767 | 9/1963 | Schneck . |
| 3,114,587 | 12/1963 | Herrmann . |
| 3,158,421 | 11/1964 | Hasenauer, Jr. . |
| 3,319,216 | 5/1967 | McCullough . |
| 3,533,049 | 10/1970 | Thompson . |
| 3,602,870 | 4/1969 | Willard . |
| 3,629,787 | 6/1970 | Wilson . |
| 3,772,775 | 11/1973 | Bonnke et al. . |
| 4,111,510 | 9/1978 | Zurcher . |
| 4,636,018 | 1/1987 | Stillie . |
| 4,770,645 | 9/1988 | Antes .................... 439/329 |
| 5,015,197 | 5/1991 | Redmond et al. ............... 439/329 |

FOREIGN PATENT DOCUMENTS

| | | |
|---|---|---|
| 2557385 | 6/1985 | France . |
| 2678782 | 1/1993 | France . |
| 1920988 | 11/1970 | Germany . |
| 2-114468 | 4/1990 | Japan ................................. 439/493 |
| 1321124 | 9/1970 | United Kingdom . |
| 1472688 | 3/1975 | United Kingdom . |

Primary Examiner—Neil Abrams
Attorney, Agent, or Firm—Gary A. Samuels

[57] ABSTRACT

This invention provides an assembly capable of connecting a flat flexible cable directly to circuitry without pins or sockets and without regard to line width or pitch. This allows the use of one cable configuration for various interconnects that would have otherwise required multiple custom cable configurations. The invention provides flat flexible circuitry whose insulation is configured to provide a resilient spring force sufficient to force exposed conductors of the circuitry firmly against conductors of devices to interconnected when the flexible circuitry is retained by a catch system on said device.

11 Claims, 6 Drawing Sheets

ELECTRICAL INTERCONNECT ASSEMBLY

FIELD OF THE INVENTION

This invention relates to an assembly for connecting flat complex circuitry to other circuitry such as printed or integrated circuit boards.

BACKGROUND OF THE INVENTION

It is often necessary to provide a means for transmitting electrical signals from one circuit device to another, such as, between circuit boards. Various connecting cable products are used for this purpose. These connectors typically are comprised of either one or more conductive wires that are directly soldered to the circuit board or devices to be interconnected or are comprised of a connector having a contact plug and socket system. Either of these methods connect one output or specific group of outputs to one input or specific group of inputs via one conductive wire embodied in a cable or as a separate entity. These methods usually require one specific conductor between each, i.e., connector A pin 1 to connector B pin 1 or board A pad 1 to board B pad 1. When utilizing a plug jack connector scheme, an appropriate size connector having the required number of contacts must be selected. This selection process involves many criteria such as conductor size, number of conductors in a cable, connector size and available space. Thus current technology often offers only a burdensome process and many times requires custom wiring diagrams, cables and connectors for each individual interconnect requirements within an application.

It would be desirable to provide a connector assembly that provided good contact paths from one board or device to another but which does not require a 1 to 1 conductor to pad or contact connection.

SUMMARY OF THE INVENTION

This invention provides an assembly capable of interconnecting flat flexible circuitry directly to other circuitry without pins or sockets and without regard to line width or pitch. This permits the assembly to be used with circuitry of a variety of configurations that would otherwise require different custom connector configurations for each variations. This invention also provides a new ribbon cable assembly.

The assembly comprises a flat, flexible strip that has a plurality of parallel conductors in one plane embedded in insulation, which insulation is configured to provide a resilient spring force sufficient to force exposed conductors of the strips firmly against conductors of the device to be connected when the strip is retained by a catch system on said device.

The definition of flat, flexible circuitry includes ribbon cable and flexible printed circuits.

The devices to be connected include printed circuit boards and integrated printed circuit boards. These are ordinarily planar boards that have conductive traces on them.

DETAILED DESCRIPTION OF THE INVENTION

Figure 1:
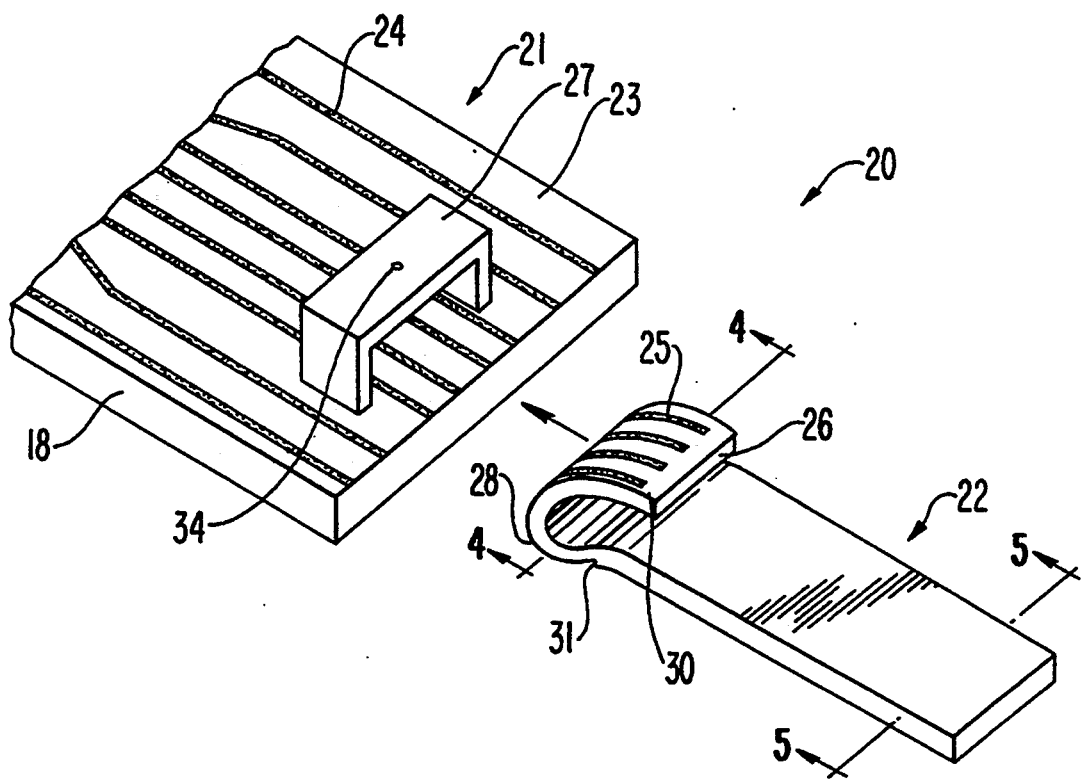
FIG. 1 is an exploded view of one embodiment of the assembly of the invention.

Referring to the Figures in general, the invention provides a connector assembly 20 for connecting flexible circuitry 22 to a planar substrate 21 comprising insulated member 18 that has conductive traces 24 on at least one surface thereof, the assembly comprising:

flexible circuitry 22 comprising a flat flexible strip of circuitry having a top face and a bottom face between which lie a plurality of parallel longitudinally extending electrically insulated conductors 25, and having at least once end 26 thereof adapted to resiliently press its conductors against conductive traces of the planar substrate, an elongated housing 27 located on said planar substrate 21, and positioned over at least one conductive trace 24 of the planar substrate 21, said housing 27 adapted to receive said flat flexible strip 22 and having means to hold said strip firmly in said housing in a manner which presses the conductors 25 against the conductive traces 24 of the planar substrate.

Figure 3:
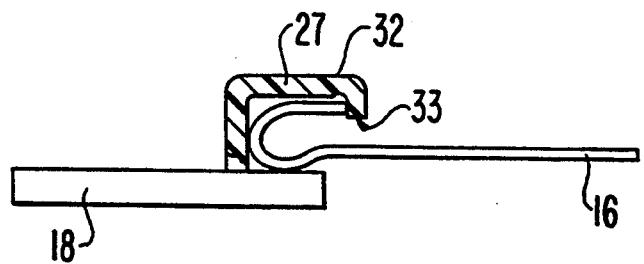
FIG. 3 is a cutaway side view of the connector of the invention which shows the interconnected device.

In one embodiment, in the flexible circuitry, the said at least one end 26 thereof is bent back in a longitudinal direction to form a resilient spring such that the top face of the bent back portion is adjacent the top face of the unbent portion of the strip, said conductors being uninsulated at the bottom face 28 opposite the bent back top face. In this instance, the elongated housing 27 can have a substantially closed top, back and sides, being open at the front and bottom, said housing having its front toward the edge of the planar substrate 21, said housing interior provided with catch means 33 (FIG. 3) constructed and arranged to hold said bent back portion of the flexible strip upon insertion of said portion into the open front of the housing. In one embodiment the housing 27 is substantially rectangular and has a catch 33 on the interior top which is configured to engage and retain the end of the bent back portion of the strip, and wherein the resiliency of the bent back portion forces uninsulated conductors 25 on the bottom face of the flexible strip (See FIG. 4) firmly against at least one conductive pad of the planar substrate as shown in FIG. 3.

End 26 has a section which defines a lateral depression at 28 from the normal plane of the strip. The elongated housing can have a hinged lid (See FIG. 7) with a front face constructed to close upon said flat flexible strip and hold said strip firmly when said strip is positioned in said housing.

Referring now to the Figures in greater detail, in FIG. 1, the connector assembly 20 of this invention has two elements, one is connected to planar substrate 21 and is a hollow housing member 27 and the other is u-shaped end 26 of flat flexible ribbon cable 22.

Figure 4:
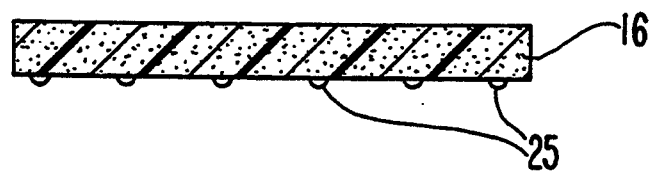
FIG. 4 is a view of the flexible ribbon cable taken along 4—4 of FIG. 1.
Figure 5:
FIG. 5 is a view of the flexible ribbon cable taken along 5–6 of FIG. 1.

The flat flexible cable 22 comprises a plurality of parallel spaced apart elongated conductors 25 (shown in FIGS. 1, 4, and 5) embedded in flexible insulation 16 as shown in FIG. 5. The insulation is stripped away to expose conductors 25 at end 26 from area 30 at the end to area 31 (See FIG. 1) on the bottom of the cable 22 so that the conductors are exposed from the end around the u-shape depicted and for a portion of the underside of the cable. This is shown in FIGS. 1 and 4. FIG. 4 is a cut-away view taken along line 4—4 of FIG. 1, while FIG. 5 is a cut-away view on line 5—5 of FIG. 1. Thus, the exposed end of the cable is bent back on itself to form a u-shape or horseshoe configuration with the exposed conductors being on the outside of the u. The u-shape configuration has a resilient spring-like character due to the resilient character of insulation 16.

The u-shaped end 26 of the cable fits snugly into the housing 27 of planar substrate 21. The housing is sized to fit the width of the connector.

Figure 6:
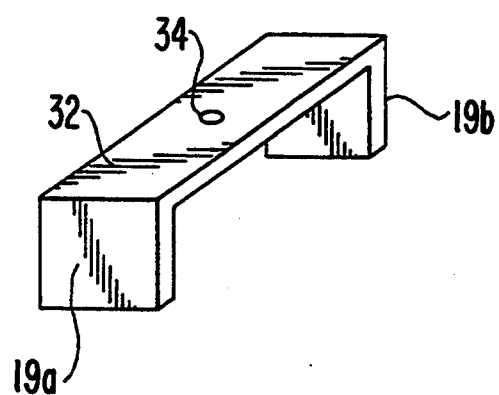
FIG. 6 is a perspective view of a housing used in the invention.

The planar substrate 21 can be any commonly multicircuit path board. Exposed electrical conductive traces 24 are located on insulated substrate 18. Housing 27, as shown in FIG. 6 comprises a top 32, sides 19a and 19b and a back (not visible). The housing fits over the exposed conductive traces 24 of the planar substrate 21 which traces run inwardly from the edge. The board is constructed of any suitable insulative material. Housing 27 is affixed to the printed circuit board by any convenient means, e.g. by an adhesive or by screws. The housing 27 and flexible cable 22 are constructed so that the cable fits snugly into the opening or cavity formed by the top and sides of the housing and by the surface of the printed circuit board. The interior ceiling of housing 27 can be tapered upward from back to front as shown in FIGS. 3 and 4. A snug fit is desirable to prevent lateral movement of the cable inside the housing. Lateral movement causes undesirable fluctuations in electrical properties.

Figure 7A:
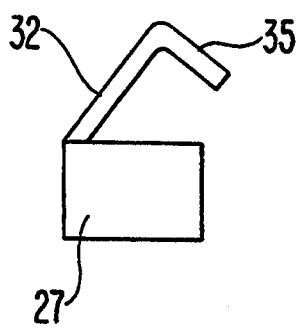
FIG. 7A and 7B depict side views of a hinged lid housing with the lid in open and in closed positions.
Figure 7B:
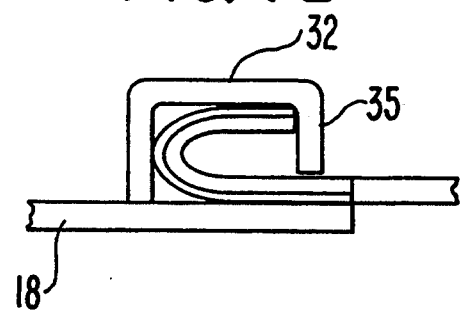

Housing 27, as shown in FIG. 3 is constructed so that the inside of the top 32 has a ridge 33 (See FIG. 3) running lengthwise along the top from side 19a to side 19b (See FIG. 7). The ridge acts as a latch which, as shown in FIG. 3, catches the curved end 26 ribbon cable 22 at 30 upon insertion of the cable into the housing.

Figure 2:
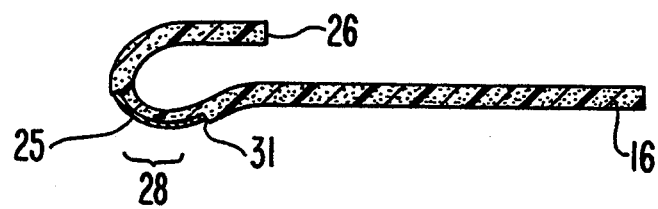
FIG. 2 is cross-section of the flexible ribbon cable used in FIG. 1.

As depicted in FIGS. 1, 2 and 3 u-shaped end 26 preferably will have a slight bulge at 28, which, because of the spring nature of the curved end, ensures good contact between conductors 25 of the cable and traces 24 of the printed circuit board.

To release the cable from the housing, an aperture 34 through top 32 (See FIG. 6) of the housing can be formed. A suitable instrument can be inserted through the aperture to depress the curved end 26 of the cable, which, because of its springiness, is depressed so that its end clears latch ridge 33. The cable can then be easily withdrawn.

In an alternative embodiment, the housing 27 can have a hinged top, as shown in FIG. 7 In this variation, the flexible cable 22 can simply be placed in housing 27 by laying it into the receptacle formed by the open lid and the open front of the housing. In this embodiment, the front closure member 35 closes to abut the flexible cable 22 and thus both aids in holding the cable in position and in sealing off the housing interior which keeps the interior free of dirt and other contamination.

Figure 8:
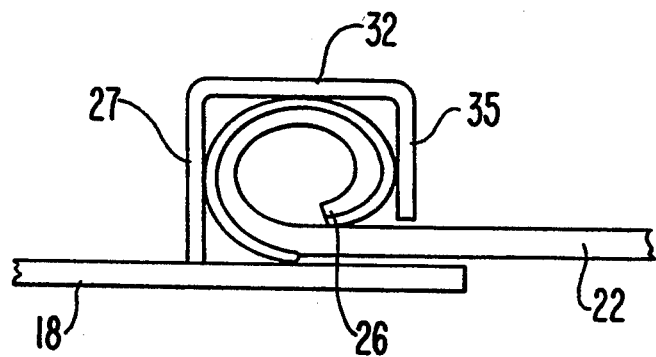
FIG. 8 depicts still another embodiment in which the ribbon cable connects and is configured in another way.

In still another embodiment, flexible cable 22 can be configured to loop completely around at its end as shown in FIG. 8. When the hinged top shown in FIG. 7 is used, the front closure member 35 secures the cable in housing 27. In addition, by looping the end around upon itself, the compressing of the resilient loop inside the housing aids in insuring good contact between the conductors 35 of the flexible cable 22 and the traces 24 of the printed circuit board 18.

Figure 14:
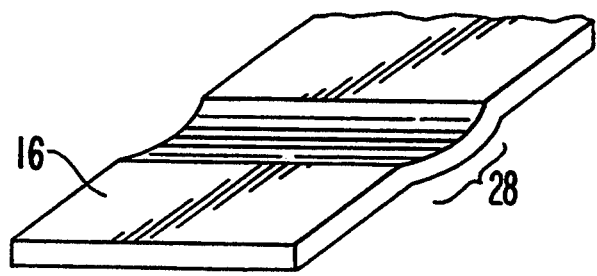
FIG. 14 depicts an alternative embodiment of the flexible circuitry 22 aspect of the invention.
Figure 9:
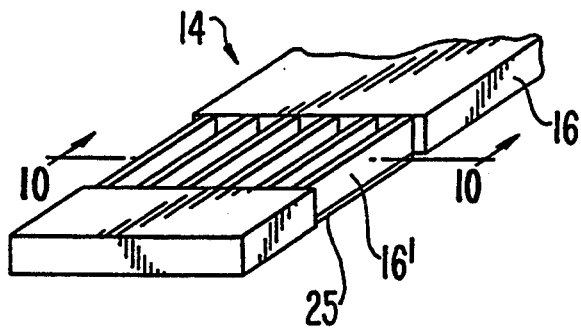
FIGS. 9, 10, 11, 12 and 13 depict views of an alternative embodiment of the flexible cable portion of the invention.

In still another variation, the flexible cable 22 need not be completely bent back in a u-shape but instead is simply depressed in the region 28 of 32 as shown by FIG. 14. Thus in region 32 the electrical conductors are exposed on the bottom and it is that depressed region that makes contact with the conductive traces 24 of planar substrate 21. In this variation the ridged top of the housing that is depicted in FIG. 3 cannot be used to catch and latch the cable since the cable is not u-shaped at the end. Instead, the hinged lid configuration of the housing (shown in FIG. 7) can be employed to hold the cable in place.

With the connector assembly of this invention, very high density conductor transmission cables can be easily connected to circuit boards. For example, very fine lines of conductive material of 0.001 to 0.005 inches wide and 0.0005 to 0.0015 inches thick can be used, and can be spaced parallel apart at a spacing of 0.002 inches between centers. The flexible cable can be as thin as 0.001 inches.

A preferred flexible cable 22 for forming the u-shaped end is a flat cable which has a plurality of electrical copper wire conductors that are 0.005 inches in width and spaced 0.010 inches apart. To make this cable, insulation made of stretched porous polytetrafluoroethylene ribbon tape impregnated with cyanate ester on which parallel conductive conductors are etched, is adhered to a polyimide substrate which is capable of being formed into a resilient configuration, i.e., a configuration which when bent will spring back into said configuration. The cyanate ester resins impart thermoset properties to the stretched porous PTFE. Representative resins include AroCy-M from Ciba-Geigy and BT2060 BH from Mitsubishi Gas Chemical. Representative polyimide substrates include Upilex ® polyimide from UBE Industries, Kapton ® polyimide from the DuPont Company, and Apical polyimide from Allied-Signal Co. Another useful substrate system is Pyralux ® flexible composites from the DuPont Company, which is made of Kapton polyimide film and an acrylic adhesive.

Cyanate ester impregnated porous PTFE sheets can be made generally as described in Example 1 of Fischer U.S. Pat. No. 5,034,801 where the ester is melted, applied to the PTFE and impressed into the porous PTFE by means of rolls. Alternatively, the ester can be applied from solvent solution (e.g. methyl ethyl ketone). The resulting product can then be heated to cure the resin.

The polyimide layer can be applied by any convenient lamination step. It can be applied by passing a film of it and the film of porous impregnated PTFE through the nips of heated rolls. A copper sheet can be applied to one side in the same manner. Alternatively, sheets of the porous impregnated PTFE, polyimide, and copper can be laid-up and pressure and heat bonded one another.

The copper connectors lines are then formed by ordinary etching procedures.

Figure 10:
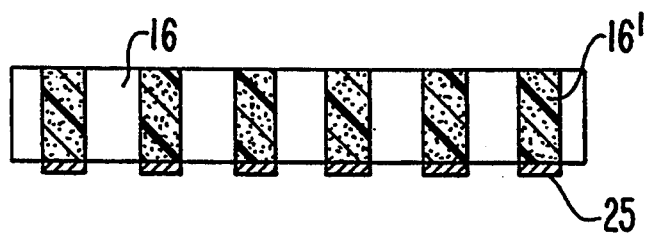
Figure 11:
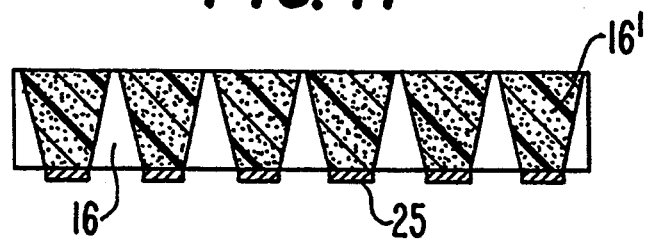
Figure 12:
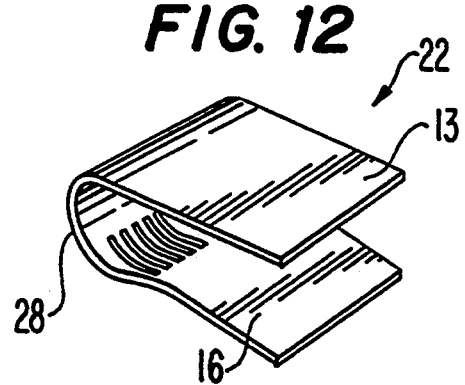
Figure 13:
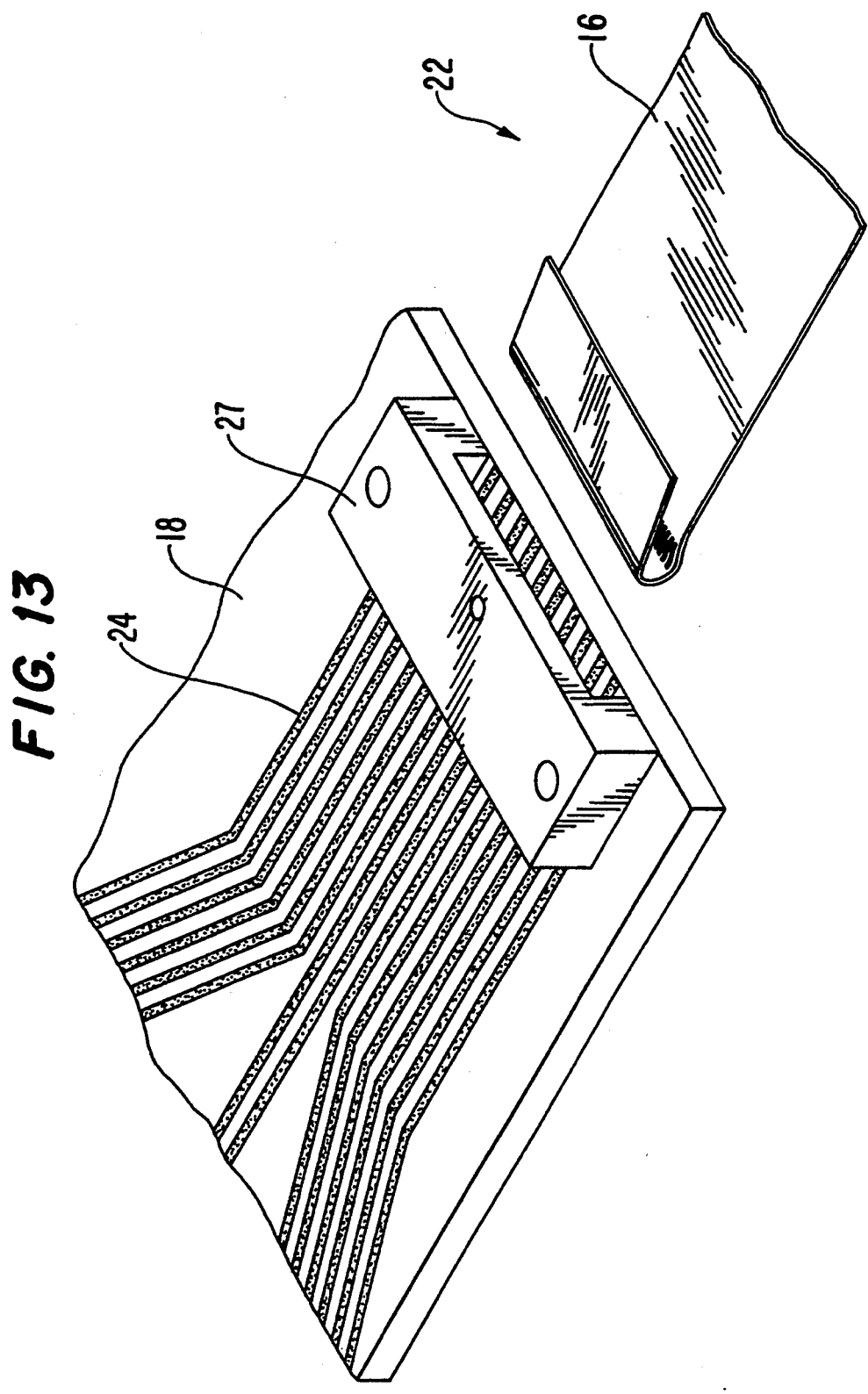

By selection of the polyimide substrate and the cyanate ester resin, a flexible cable substrate can be obtained which can be molded into a bent, e.g., u-shape configuration which is flexible, resilient and springy. To make the u-shape, the end of the ribbon cable can be drawn around a heated round elongated pin to form the u and held in place while heat from the pin is applied. It is believed that crosslinking of the cyanate ester occurs. Still another embodiment of the cable element is shown in FIGS. 9, 10, 11, 12 and 13. It is a common deficiency in many printed circuit boards that the substrate board 18 (See FIG. 1) is not completely planar, i.e., it contains "valleys" and "hills" over its surface. Thus, when a ribbon cable interconnect is employed, the variation in surface planarity of the board causes uneven contact between the traces of the board and the conductors of the cable. To obtain good contact, in one variation of the invention the conductors 25 of the flexible cable 22 are exposed in area 28 of FIG. 2 even more by removing all insulation between the conductors. The insulation can be conveniently removed by laser beam. This enables the conductors to "ride" freely. Thus, the compressive force on the exposed conductors that occurs when flexible cable 22 is inserted into housing 27 forces the conductors against conductive traces 24 even though conductive traces 24 may not be coplanarly aligned. FIGS. 9, 10, 11 and 12 depict this configuration. FIG. 10 is a view of FIG. 9 taken along line 9—9 of FIG. 8. The two FIGS. (9 and 10) depict conductors 25 with insulation 16 removed from all sides except the top as shown by 16$^1$, so as to form "windows" or openings through the cable. The flexible cable 22 is then bent back upon itself as shown in FIG. 12, and is then ready to be inserted into housing 27 as shown in FIG. 13. The insulation 161 can form a rectangular shape over the conductors 25 as shown in FIG. 10 or can form a trapezoidal shape as shown in FIG. 11. The trapezoidal shape provides stability in the x and y directions while still allowing free movement in the z direction.

Figure 15:
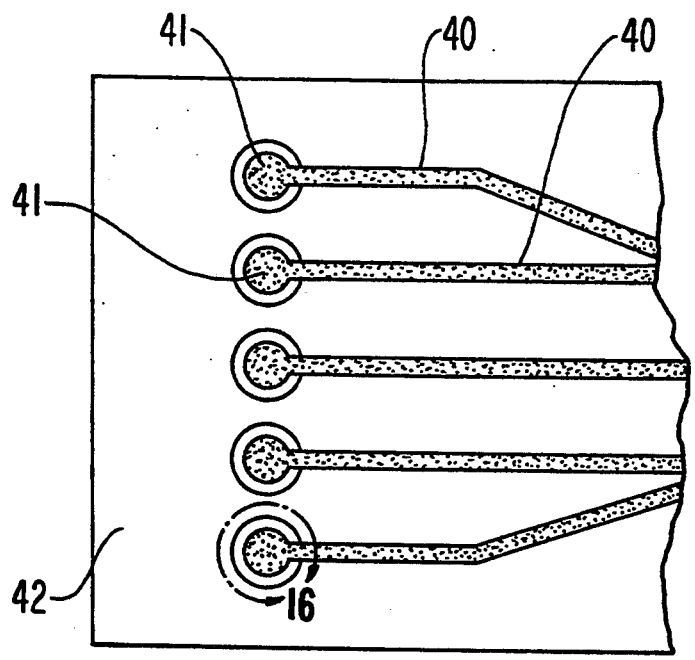
FIG. 15 depicts another variation of flexible circuitry.
Figure 16:
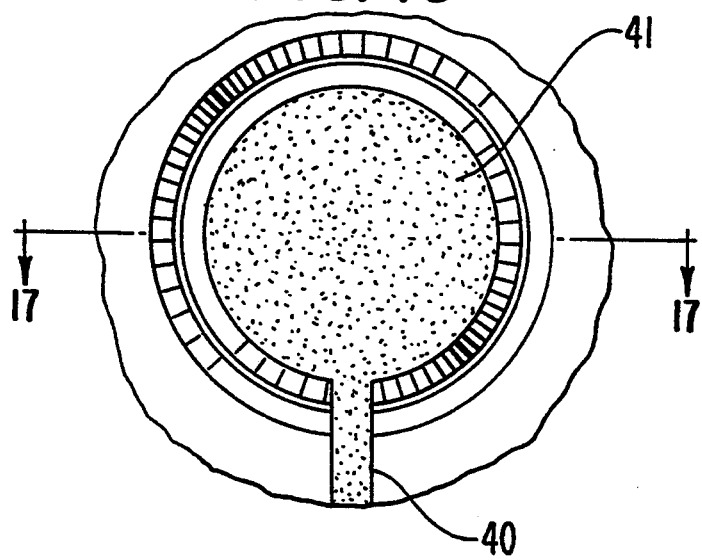
FIG. 16 is an enlargement of the circled portion of FIG. 15.
Figure 17:
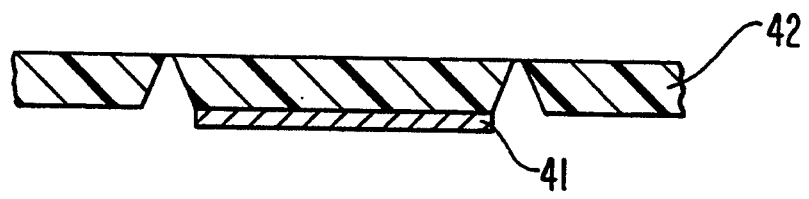
FIG. 17 is a cutaway side view of the circuitry of FIG. 16 taken along lines 17—17 of FIG. 16.

Another variation on the ribbon interconnect cable element is shown in FIGS. 15, 16 and 17. In these figures, conductive traces 40 end in pads 41 on insulation substrate 42. FIG. 16 is an enlargement of the circled portion of FIG. 15 and shows the trapezoidal shape that the backing of pads 41 has. This trapezoidal shape is shown more clearly in FIG. 17. Thus, it is seen that pads 41 are connected to the interconnect only through the integral backing on trace 40.

One use of the interconnect cable element shown in FIG. 13 is in a connector assembly for connecting one printed circuit board to another printed circuit board having one end of the circuitry bonded by ultrasonic welding, solder or conductive glue to make electrical contact between at least one conductive trace of the flexible circuitry and one conductive trace of the first printed circuit board (mother board) while opposite end of the flexible circuitry is supported in a rectangular elongated housing allowing another printed circuit board (daugther board) to be inserted into said housing thus forcing at least one conductive trace on printed circuit board (daughter board) against at least one conductive trace on said flexible circuitry.

Example

Using procedures described immediately above, a flexible ribbon cable having a u-shape at both ends was prepared. The cable was 6 inches long and 0.515 inches wide and 0.005 inches thick. It was made of a laminate of expanded porous PTFE in which the pores of the PTFE were impregnated with a cyanate ester resin, namely Ciba-Geigy's AroCy-M. Laminated to the expanded PTFE was a layer of Upilex S polyimide film. In some cables made, the Upilex layer was 4 mil thick. In others it was 0.8 mil thick. The cable had 49 0.005 inch wide ½ ounce copper wire conductor lines on it.

A housing was molded and was adhered to a printed circuit board by adhesive.

One printed circuit board had eleven circuit pads. On one board ten of the pads were 0.034 inch wide with an 0.049 inch center to center spacing, thus leaving a 0.015 inch gap between pads. This board had one pad having a 0.132 inch width located in the center with five of each of the other pads on either side. A second board was similar in layout, i.e. 5 smaller pads on either side of a larger pad, except that the smaller pads were 0.036 inch wide on 0.049 inch centers, thus leaving a 0.013 inch gap between pads.

The flexible cable was plugged into each board/connector housing so that the board having the smaller between pad gaps was at one end of the cable while the board having the larger between pad gaps at the opposite end.

Using a Fluke multi meter the continuity between boards and adjacent pads was tested. The results showed between boards, pad to pad, resistance of 0.3 to 1.2 ohms. Next each line in the cable was tested to determine the number of lines making contact on each pad. It was found that 2 to 4 lines made contact with the small pads. Where 2 lines contacted a 1.2 ohm resistance was measured between boards, where 3 lines contacted 0.7 ohm resistance was measured between boards, and where 4 lines contacted 0.4 ohm resistance was measured between boards. The large pads measured 0.3 ohms between boards and contacted 14 lines.

Lines in the cable were measured directly giving a reading of 0.8 ohms for one line and 0.4 ohms for two lines.

The above measurements were repeated using a 4 wire method. Measurements results were nearly identical board to board. An additional measurement was made from the board pad to 1 cable line within ½ inch of the mating area. This measurement result was 0.075 ohm with one cable line contacted and 0.035 ohm with two lines contacted. These last two measurements most closely represent actual contact resistance between the board and the integrated cable connector.

Thus, this invention provides an interconnect that can be assembled quickly and yet provides effective connection because several adjacent conductor lines are employed to connect like pads. This concept is sometimes called multipathing from pad to pad.

I claim:

1. A connector assembly for connecting flexible circuitry to a planar substrate that has conductive traces on at least one surface thereof, the assembly comprising:

flexible circuitry comprising a flat flexible strip of circuitry having a top face and a bottom face between which lie a plurality of parallel longitudinally extending electrically insulated conductors, and having at least one end thereof bent back in said longitudinal direction to form a resilient spring such that the top face of the bent back portion is adjacent the top face of the unbent portion of the strip, said conductors being uninsulated at the bottom face opposite the bent back top face, and adapted to resiliently press its conductors against conductive traces of the planar substrate, an elongated housing located on said planar substrate, and positioned over at least one conductive trace of the planar substrate, said housing adapted to receive said bent back end of the flat flexible strip and having means to hold said strip firmly in said housing in a manner which presses the conductors against the conductive traces of the planar substrate.

2. The connector assembly of claim 1 wherein the elongated housing has a substantially closed top, back and sides, and being open at the front and bottom, said housing having its front toward the edge of the substrate, said housing interior provided with catch means constructed and arranged to hold said bent back portion of the flexible strip upon insertion of said portion into the open front of the housing.

3. The connector assembly of claim 1 wherein in the portion of the flexible circuitry where the conductors are adapted to resiliently press against the conductive traces of the planar substrate, the conductors extend laterally across the flat flexible strip and define a lateral depression from the normal plane of the strip.

4. The connector assembly of claim 3 wherein said section comprises an area in which the insulation has been stripped away to form windows through the flat flexible strip.

5. The connector assembly of claim 3 wherein the elongated housing has a hinged lid with a front face constructed to close upon said flat flexible strip and hold said strip firmly when said strip is positioned in said housing.

6. The connector assembly of claim 1, 2 or 4 wherein the flexible circuitry is a ribbon cable.

7. The connector assembly of claim 1, 2 or 4 wherein the flexible circuitry is flexible printed circuit.

8. The connector assembly of claim 1, 2 or 4 wherein the planar substrate is a printed circuit board.

9. The connector assembly of claim 1, 2 or 4 wherein the planar substrate is an integrated circuit board.

10. The connector assembly of claim 2 wherein the housing is substantially rectangular and has a catch means on the interior top which is configured to engage and retain the end of the bent back portion of the strip, and wherein the resiliency of the bent back portion forces uninsulated conductors on the bottom face of the flexible strip firmly against at least one conductive pad of the planar substrate.

11. A method for connecting a substantially flat flexible ribbon cable to a surface conductor on a printed circuit board, the method comprising the steps of:

fixedly attaching a connector housing to the printed circuit board at the location of the surface conductors, said connector housing having an inner surface and an outer surface, said connector housing forming a recess within said housing between said inner surface and the printed circuit board, said connector housing having a substantially rectangular opening to provide access to said recess, said connector housing further having a retaining means for engaging and retaining the ribbon cable within said recess;

bending an end portion of the ribbon cable to form a u-shaped end portion, said u-shaped end portion having a first longitudinal portion formed from said end portion, a curved apex portion, and a second longitudinal portion formed by a remaining portion of the ribbon cable;

removing insulation from an outer face of said second longitudinal portion of the ribbon cable adjacent said apex portion to expose at least one conductor; and inserting said u-shaped end portion into said opening in said connector housing such that said exposed at least one conductor is brought into electrical contact with said surface conductor within said recess and such that said retaining means engages said end of the ribbon cable to secure said u-shaped end portion of the ribbon cable within said recess, said electrical contact between said at least one conductor and said surface conductor being maintained by a resiliency of said u-shaped portion of said ribbon cable acting against said inner surface of said connector housing.

* * * * *